(12) United States Patent
Craes et al.

(10) Patent No.: US 12,489,017 B2
(45) Date of Patent: Dec. 2, 2025

(54) METHOD OF MANUFACTURING A SEMICONDUCTOR PACKAGE, DIE, AND DIE PACKAGE

(71) Applicant: Infineon Technologies AG, Neubiberg (DE)

(72) Inventors: Fabian Craes, Soest (DE); Wolfgang Lehnert, Lintach (DE); Maik Lohmann, Soest (DE); Harry Walter Sax, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 914 days.

(21) Appl. No.: 17/575,000

(22) Filed: Jan. 13, 2022

(65) Prior Publication Data
US 2022/0230919 A1    Jul. 21, 2022

(30) Foreign Application Priority Data

Jan. 15, 2021    (DE) ..................... 10 2021 100 737.2

(51) Int. Cl.
| | |
|---|---|
| *H01L 21/78* | (2006.01) |
| *H01L 21/56* | (2006.01) |
| *H01L 23/29* | (2006.01) |
| *H01L 23/31* | (2006.01) |
| *H01L 23/00* | (2006.01) |

(52) U.S. Cl.
CPC ............ *H01L 21/78* (2013.01); *H01L 21/561* (2013.01); *H01L 21/568* (2013.01); *H01L 23/291* (2013.01); *H01L 23/3171* (2013.01); *H01L 24/48* (2013.01); *H01L 2224/48225* (2013.01)

(58) Field of Classification Search
CPC ... H01L 21/561; H01L 21/568; H01L 23/291; H01L 23/3171; H01L 24/48; H01L 2224/48225
See application file for complete search history.

(56) References Cited

U.S. PATENT DOCUMENTS

| | | |
|---|---|---|
| 6,429,148 B1 | 8/2002 | Chu et al. |
| 6,943,098 B2 | 9/2005 | Yeh et al. |
| 7,387,949 B2 | 6/2008 | Fukazawa |
| 7,446,032 B2 | 11/2008 | Kailasam |
| 10,373,871 B2 | 8/2019 | Brunnbauer et al. |
| 10,622,346 B2 | 4/2020 | Schmenn et al. |
| 10,658,240 B1* | 5/2020 | Iriguchi ................. H01L 24/09 |
| 11,152,216 B2 | 10/2021 | Ogihara |

(Continued)

FOREIGN PATENT DOCUMENTS

| | | | |
|---|---|---|---|
| CN | 110311015 A | * 10/2019 | ....... H01L 21/68764 |
| DE | 10 2016 118 70 | 1/2018 | |

(Continued)

*Primary Examiner* — Mohammad M Choudhry
(74) *Attorney, Agent, or Firm* — Dicke, Billig & Czaja, PLLC

(57) ABSTRACT

A method of manufacturing a semiconductor package is provided. The method may include singulating a wafer including a plurality of dies fixed to an auxiliary carrier to generate dies having released side surfaces, covering at least the side surfaces of the dies with a passivation layer using a deposition process at a temperature below the melting temperature of the auxiliary carrier, keeping a gap between the passivation layers at the side surfaces of adjacent dies of the plurality of dies.

20 Claims, 6 Drawing Sheets

(56) References Cited

U.S. PATENT DOCUMENTS

| | | | |
|---|---|---|---|
| 2005/0167799 A1 | 8/2005 | Doan | |
| 2013/0277813 A1* | 10/2013 | Torwesten | H01L 24/85 |
| | | | 257/676 |
| 2014/0175623 A1 | 6/2014 | Pagaila et al. | |
| 2016/0141208 A1* | 5/2016 | Joachim | H01L 24/95 |
| | | | 438/114 |
| 2016/0244326 A1* | 8/2016 | Bretthauer | B81C 1/00904 |
| 2017/0040272 A1 | 2/2017 | Chong et al. | |
| 2017/0092626 A1* | 3/2017 | Yuan | H01L 25/167 |
| 2017/0345716 A1* | 11/2017 | Brunnbauer | H01L 21/308 |
| 2018/0096984 A1* | 4/2018 | Schmenn | H01L 21/78 |
| 2020/0176438 A1 | 6/2020 | Schmenn et al. | |
| 2022/0016768 A1* | 1/2022 | Tseng | H01L 21/67144 |

FOREIGN PATENT DOCUMENTS

| | | |
|---|---|---|
| EP | 2073259 | 6/2009 |
| WO | 19167290 | 9/2019 |

\* cited by examiner

METHOD OF MANUFACTURING A SEMICONDUCTOR PACKAGE, DIE, AND DIE PACKAGE

CROSS-REFERENCE TO RELATED APPLICATION

This Utility patent application claims priority to German Patent Application No. 10 2021 100 737.2, filed Jan. 15, 2021, which is incorporated herein by reference.

TECHNICAL FIELD

Various embodiments relate generally to a method of manufacturing a semiconductor package and to a die.

BACKGROUND

Semiconductor power modules are built to protect semiconductors against electrical, thermal, mechanical, chemical and environmental impacts. Vice versa, all constituents of the power module assembly themselves are supposed to comply with the semiconductor devices in terms of these impacts.

Typically, the frontend process chain ends with chips (also referred to as dies) mounted to an adhesive tape after a wafer singulating process, e.g. a dicing process. On chip sidewalls, semiconductor material of the diced semiconductor wafer, e.g. bare silicon, and front—(FSM) and backside (BSM) metallizations are typically exposed.

In a backend assembly process, the chips are picked up from the adhesive tape and transferred to die attach processes like e.g. sintering or soldering.

The unprotected sidewall structure of the chips with defects in the layered structure generated by the singulating process may be prone to various interactions with backend materials used in subsequent assembly processes.

The interactions may for example include an effect of (ionic) contaminations from package materials on electrical characteristics of the chip, chemical reactions of solder ingredients with the chip silicon, of potting/mold compound ingredients with the chip silicon, of housing/potting/mold compound ingredients with the FSM/BSM (e.g. corrosion), and/or of humidity and/or harmful gases with the FSM/BSM (e.g. corrosion), all of which might lead to chip failure.

Furthermore, in view of interactions mentioned above, it may be necessary to limit a module temperature, for example activation temperatures in processes/tests.

Currently, the issues mentioned above are avoided by using packaging materials and manufacturing processes that are able to cope with the unprotected chip sidewalls.

This means limited options in terms of finding the right fit for cost and performance requirements. Furthermore, there is no catalog of known chip-material interactions and derived material specifications.

Second source materials, in particular regarding potting/mold compound and housing, often have various, often unknown, constituents, which may be known only to the supplier, and may thus have a high risk for unknown or unexpected chip interactions.

In addition, some die attach technologies may not comply with restrictions with unprotected chip sidewalls, e.g. certain solder alloys and corresponding processes can be cost efficient die attach technologies for high performance requirements, but have a risk for chemical reactions with the bare silicon exposed at the chip side walls, and solder and sinter pastes may cause harmful (e.g. corrosive) environments for unprotected chip sidewalls during processing.

At present, a general trend exists to increase module operation temperature. This may require new and more complex materials and assembly processes that currently come at a high risk for negative impact on the chip performance. A study of these interactions may involve an enormous effort for development and qualification, with a significant impact on cost and duration of the associated package development projects.

SUMMARY

A method of manufacturing a semiconductor package is provided. The method may include singulating a wafer including a plurality of dies fixed to an auxiliary carrier to generate dies having released side surfaces, covering at least the side surfaces of the dies with a passivation layer using a deposition process at a temperature below the melting temperature of the auxiliary carrier, keeping a gap between the passivation layers at the side surfaces of adjacent dies of the plurality of dies.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a method of manufacturing a semiconductor package, e.g. a die package, is provided that allows to protect the semiconductor (the die), especially its sidewalls, on a wafer level directly after a separation into individual units (dies), and thus before any redistribution process (pick and place on e.g. leadframe). The protection may be provided in such a way that the die is still bondable and solderable.

In various embodiments, a surface passivation and protection of the die sidewalls is provided by applying a surface coating after wafer singulating (e.g., dicing) without reconstitution (i.e. changing the arrangement of the chips on the adhesive tape or transfer to another tape). In other words, the passivation may be performed at an interface between front end processing and back end processing of the die.

The passivation layer may be configured to not add any electrical function to the wafer, but to provide a protection against chemical interactions with backend materials and environmental influences.

The coated die sidewalls may, in various embodiments, provide various improvements in terms of die-material (e.g., die-package material) and/or die-environment interactions. For example, the coated die sidewalls may make new materials and processes (diffusion soldering, new soldering alloys and insulation materials) possible, may make an introduction of second source material easier and may enhance a robustness against humidity and harmful gasses (for example $H_2S$). Additionally, the protection of large areas of the front side metallization may be beneficial for applications in harmful environments (high humidity, harmful gases).

Figure 1A:
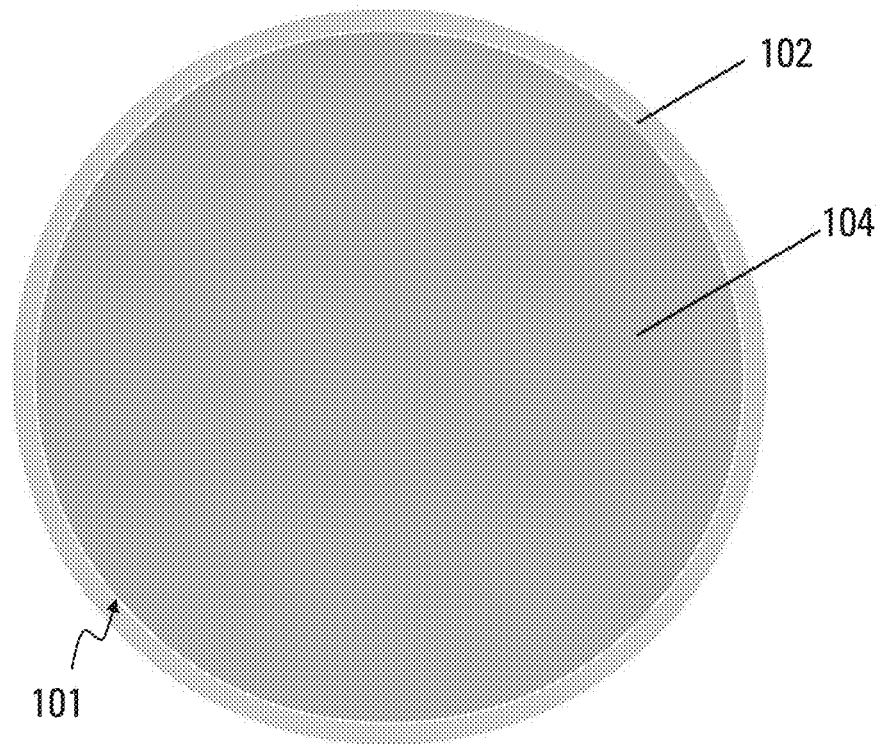
FIGS. 1A to 1C illustrate a method of manufacturing a semiconductor package in accordance of various embodiments.
Figure 1A:
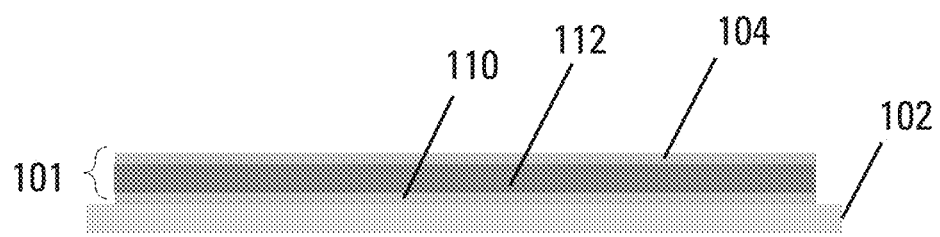
Figure 1B:
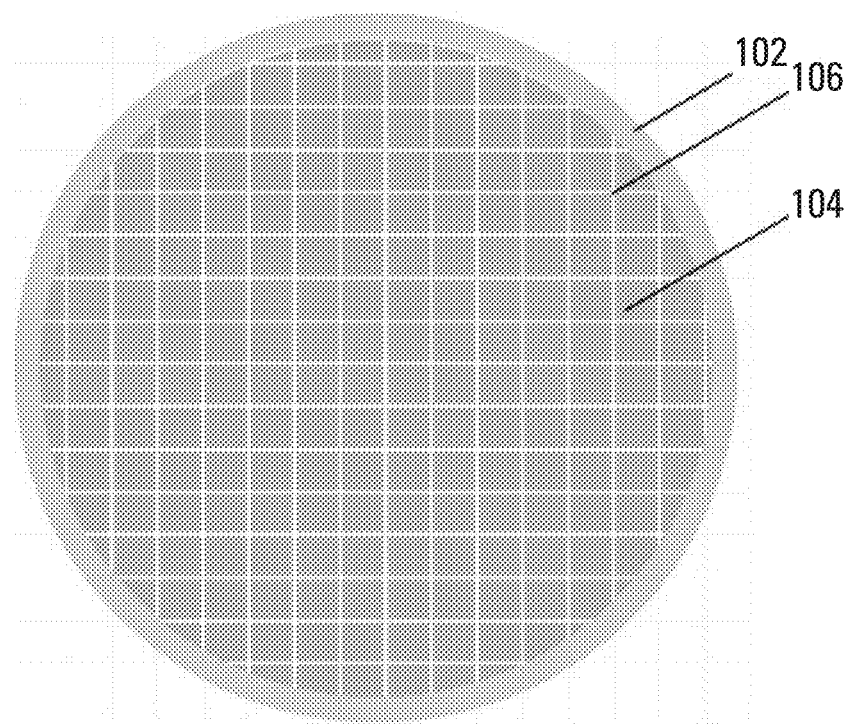
Figure 1B:
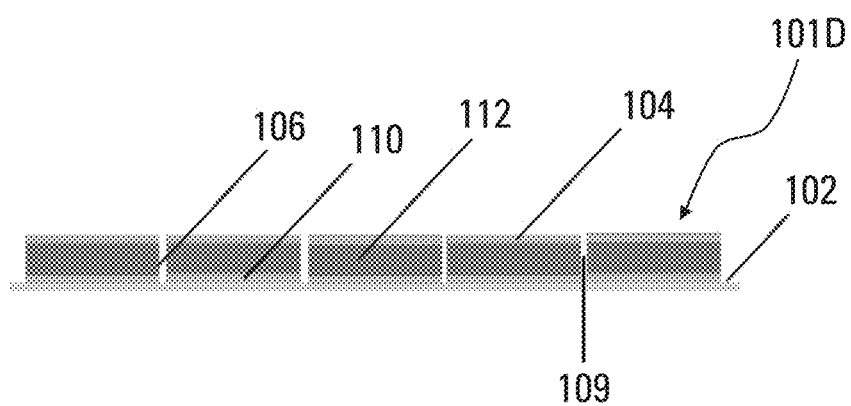
Figure 1C:
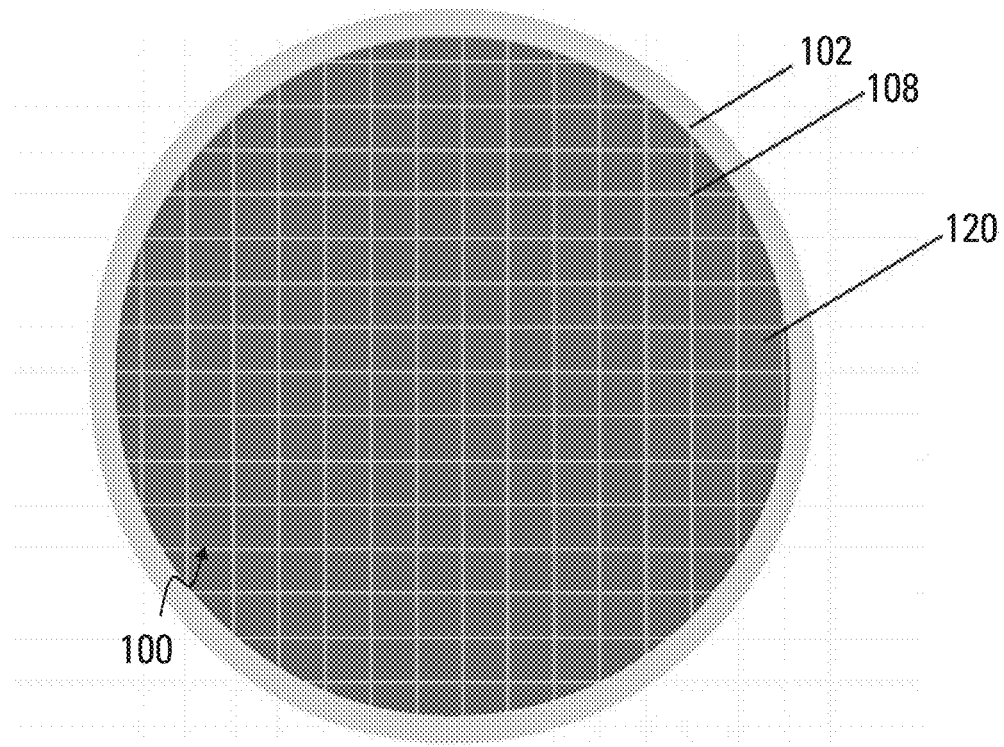
Figure 1C:
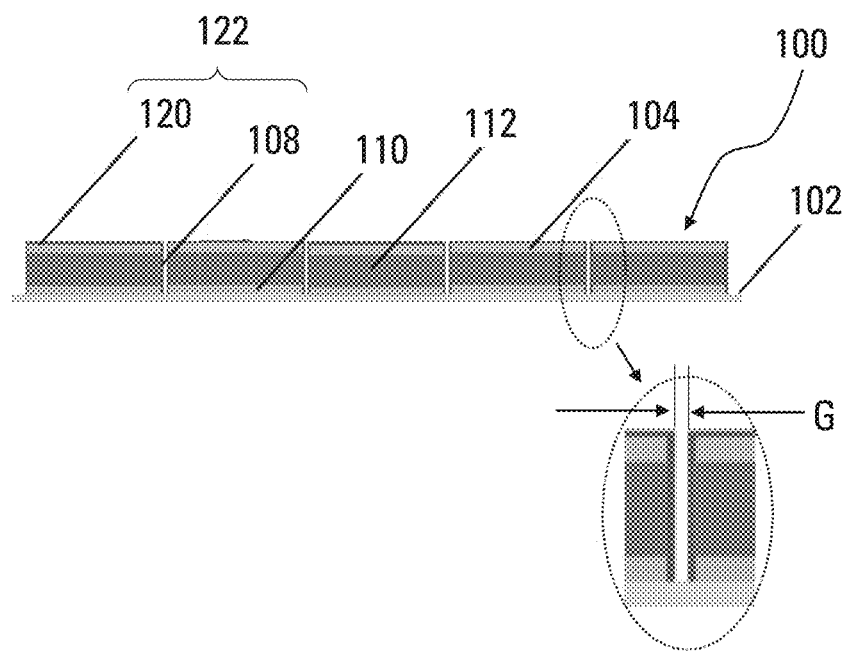
Figure 2:
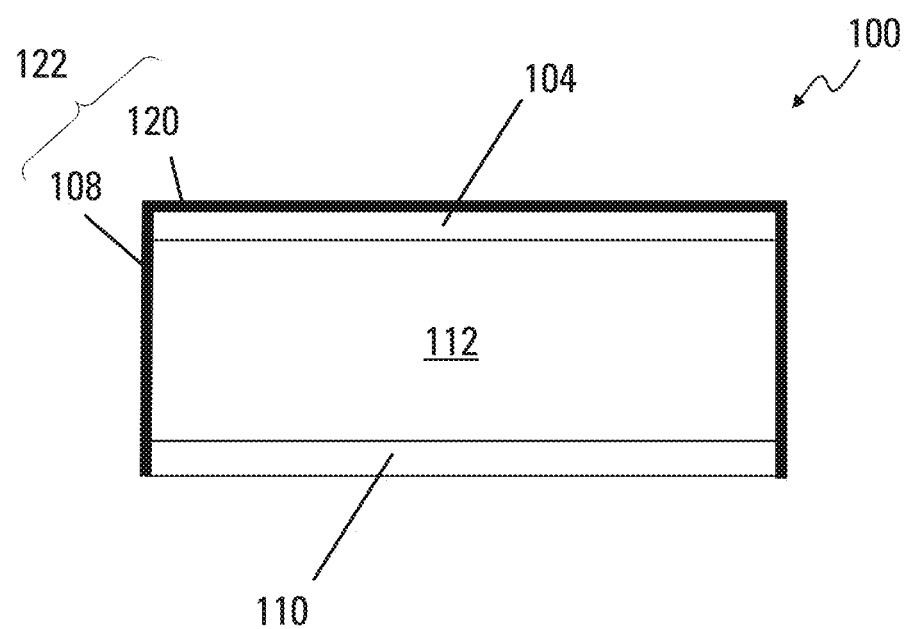
FIG. 2 shows a schematic cross-sectional view of a die in accordance with various embodiments.
Figure 3:
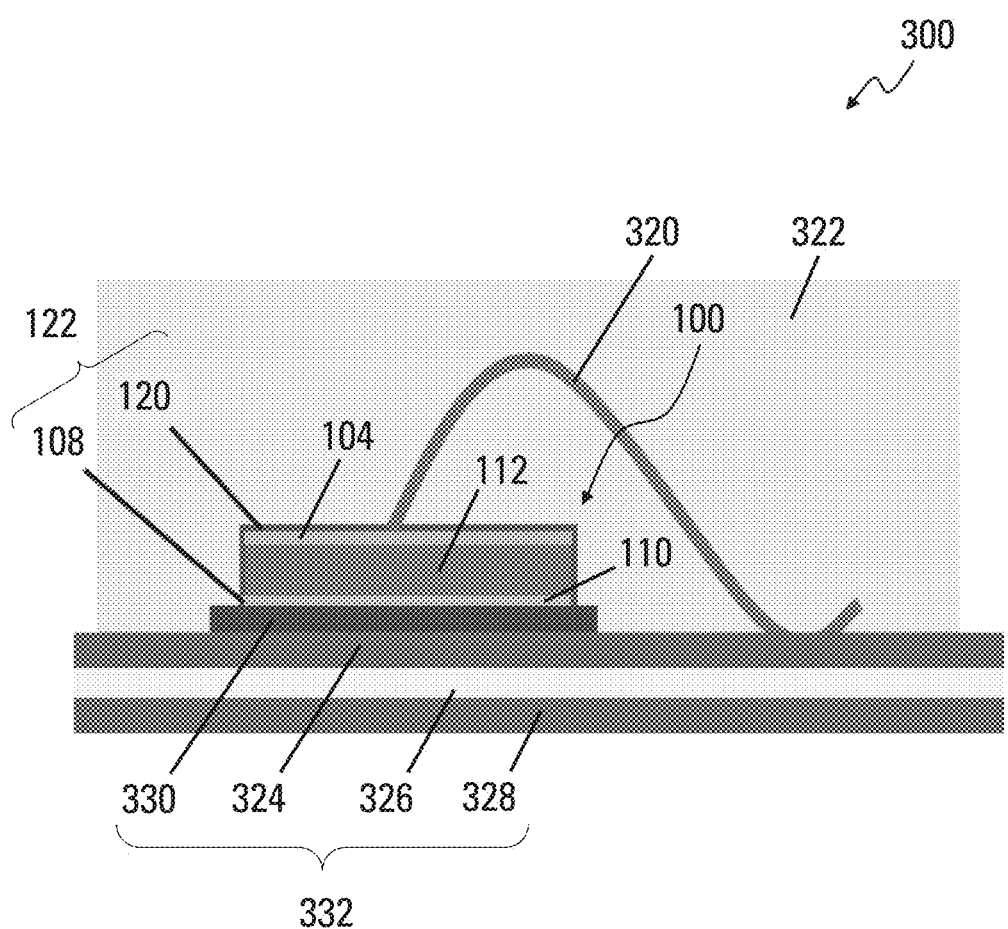
FIG. 3 shows a schematic cross-sectional view of a die package in accordance with various embodiments.

FIGS. 1A to 1C illustrate a method of manufacturing a semiconductor package 100, e.g. a die package, in accordance with various embodiments, FIG. 2 shows a schematic cross-sectional view of a die 100 in accordance with various embodiments, and FIG. 3 shows a schematic cross-sectional view of a die package 300 in accordance with various embodiments. The final die 100 includes a passivation layer 122. Portions of the wafer 101 that form the basis of one of these final dies 100 are referred to as dies 101D.

A starting point for forming the semiconductor, e.g. the die 100 in accordance with various embodiments may be a semiconductor wafer 101, which may include a plurality of dies 101D, each of which may include at least one semiconductor device, integrated circuit, or the like. The semiconductor wafer 101 may include a semiconductor material 112, for example silicon, gallium arsenide, silicon carbide, or any other suitable semiconductor material.

In various embodiments, the semiconductor wafer 101 may further include a front side metallization 104 formed on a first main surface of the semiconductor material 112 of the semiconductor wafer 101, and/or a backside metallization 110 formed on a second main surface of the semiconductor material opposite the first main surface.

The semiconductor wafer 101 may be fixed to an auxiliary carrier 102, e.g. an adhesion tape, for example a polymer adhesion tape, with its first main surface or with its second main surface. The auxiliary carrier 102 may have a melting temperature of about 150° C., for example at least 150° C.

The semiconductor wafer 101 may in various embodiments be diced, e.g. by forming trenches 109 between adjacent dies 101D, into a plurality of dies 101D, thereby releasing side surfaces 106 of the dies 101D.

The trenches 109 may, in various embodiments, extend completely through the wafer 101 to the auxiliary carrier 102. In various embodiments, the trenches 109 may extend only partially through the wafer 101, for example through the front side metallization 104 or the back side metallization 110, if present, which may be arranged facing away from the auxiliary carrier 102, and, at least mostly, through the semiconductor material 112. Optionally, the trenches 109 may further extend through the other of the front side metallization 104 and the back side metallization 110, if present, which may be fixed to the auxiliary carrier 102.

In other words, before a passivation, a complete separation (on stretched foil and on unstreched foil as the auxiliary carrier 102) or a partial separation of back side or front side of adjacent dies 101D, or any combination of the separation processes may be used.

In various embodiments, the trenches 109 may at least be deep enough to ensure that after the protective processing that will be described in more detail below and a subsequent final singulation of the dies 100, no vulnerable portions remain unprotected on die side surfaces 106. For example, only the front side metallization 104 or the back side metallization 110, which may have remained at least partially intact after the dicing, may be partially exposed on the side surface 106 of each die 100, but no portion of the semiconductor material 112 may be exposed. In another example, only the first main surface of the wafer 101 may have the front side metallization 104 formed thereon, and the semiconductor material 112 may be fixed to the auxiliary carrier 102. The singulating may be conducted as a dice-before-grind process. In other words, the singulating and the to be described protection process may be applied, and the final separation of the individual dies 100 may be achieved by re-arranging to a second auxiliary carrier and subsequent grinding until the trenches 109 are exposed.

In various embodiments, the dies 101D may be completely separated from their adjacent dies 101D before the protection process is applied.

For the singulating, any method used in the art that allows to form the trenches 109 that have a width of at least 10 µm, for example such that a distance between all adjacent generated dies 101D of the plurality of dies 101D is in a range from about 10 µm to about 50 µm, may be suitable, for example dicing methods like sawing, laser cutting, or (e.g. plasma) etching.

In various embodiments, a singulating process that includes forming a singulating region and subsequent stretching (optionally bending) of the auxiliary carrier 102, which may increase a distance between adjacent dies 101D, may be used, for example stealth dicing using a laser, as long as the stretching allows to separate the adjacent dies by at least about 10 µm.

After the singulating process, the dies 101D may still be fixed to the auxiliary carrier 102. On their side surfaces 106, one or more materials may be exposed, for example the semiconductor material 112, and optionally the first metallization 104, the second metallization 110, one or more layers of further semiconductor material that may have been arranged on the wafer 101, layers of insulating material, etc.

In various embodiments, the method may further include covering at least the side surfaces 106 of the dies 101D with a passivation layer 122 using a deposition process. The portion of the passivation layer 122 formed on the chip side surfaces 106 is referred to as the passivation layer 108, and an optional portion of the passivation layer 122 formed on the main surface of the dies 101D facing away from the auxiliary carrier 102 may be referred to as the passivation layer 120. If the passivation layer 120 is formed, it may in various embodiments be formed together, in other words, in a common process, with the passivation layer 108.

The passivation layer 122 may be formed at a temperature below a melting temperature of the auxiliary carrier 102. Furthermore, the passivation layer 122 may be formed keeping a gap of width G between the passivation layers 108 at the side surfaces of adjacent dies 100 of the plurality of dies 100.

In various embodiments, a layer thickness of the passivation layer 122 may be selected to allow the at least one back-end-of-line process to penetrate through the passivation layer 122. The layer thickness of the passivation layer 122 may for example be in a range from about 1 nm to about 50 nm, for example from about 5 nm to about 30 nm, for example from about 5 nm to about 20 nm, for example from about 1 nm to 10 nm or less than 10 nm.

The deposition process may in various embodiments be performed at a temperature below approximately 150° C. On the one hand, this may, for many materials that may be used as the auxiliary carrier 102, e.g. a typical polymer adhesion tape, ensure that the deposition temperature is below the melting temperature of the auxiliary carrier 102.

The deposition process may include or consist of atomic layer deposition (ALD), plasma enhanced atomic layer deposition (PEALD), pulsed atomic layer deposition (pulsed ALD), pulsed atomic layer chemical vapor deposition (pulsed AL-CVD), and/or metal organic chemical vapor deposition (MOCVD) for forming the passivation layer 122.

The atomic layer deposition (ALD) and the plasma enhanced chemical vapor deposition (PECVD) technology may be particularly suitable for addressing the low temperature embodiments, since these techniques may be able to cope with process temperatures of less than 150° C. For example, in a PECVD coating process, a thin silicon oxide ($SiO_2$) sidewall coating 108 may be generated on the sidewalls 106 of the dies 101D (and optionally also the top coating 120 on the top surfaces of the dies 101D) by using hexamethyldisiloxane (HMDSO).

By using an auxiliary carrier 102 with a thermal stability of minimum about 150° C. (e.g., a melting point of above 150° C.), also thermal ALD processes may be possible, for example for depositing an aluminum oxide ($Al_2O_3$) passivation layer 122. For a passivation from a back side of the die 100 (e.g. top mounted wafers 101 with backside grinding and pre-sawing), a solderable passivation layer 122 formed by the low-temperature deposition of $Al_2O_3$ may be provided.

In various embodiments, in an ALD process, various types of thin film passivation layers 122 (oxides, fluorides, nitrides, metals and more) may be generated, depending on the precursor materials.

For low voltage dies 100 (small, thin geometry), the cheaper and faster PECVD may be used. Low voltage applications (<1.2 kV) tend to have reduced chip-material interactions compared to high voltage (>>1.2 kV) applications. Thus, the reduced aspect ratio capabilities of PECVD may be sufficient to coat the rather low sidewalls 106 (with a height of less than 100 μm), and even though the passivation layer 122 formed by PECVD may have a higher defect density, this may still be sufficient to achieve the anticipated benefits in the low-voltage regime.

Especially PEALD processes may be suitable for providing low temperature deposition of high quality thin films (for example with a thickness of less than about 10 nm) that may be used as or for the passivation layer 122. For most suitable materials like $Al_2O_3$, $TiO_2$, $SiO_2$, $Ta_2O_5$, $ZrO_2$, and any combinations of these materials, precursors for plasma enhanced low temperature ALD are available.

In various embodiments, the passivation layer 122 may be a layer stack including a plurality of individual layers, which in total may have the thickness in the range from about 1 nm to about 50 nm.

The passivation layer 122 may, in various embodiments, include or consist of an oxide, for example aluminum oxide, titanium oxide, silicon oxide, tantal oxide, and zirconium oxide, a fluoride, a nitride, and/or a metal. The metal may be used in configuration where it is ensured that the metal passivation layer 122 does not create an electrically conductive path between the front side metallization 104 and the back side metallization 110. For example, the metal passivation layer 122 may be used if only one of the metallizations 104, 110 is formed in the die 100, or in a layer stack 122 having an insulating layer below the metal layer.

In various embodiments, the method may include performing at least one back-end-of-line process for the dies 100 having the covered side surfaces 106.

In various embodiments, the passivation layer 122 may be thin enough to allow the back-end-of-line process to be performed through the passivation layer 122. For example, a thick wire bonding process may be performed on the front side metallization 104 or on the back side metallization 110 via a cutout in the passivation layer 122 generated during the wire bond process. For example, the wire 320 shown in FIG. 3 may have been bonded to the front side metallization 104 through the passivation layer 120, 122 without a dedicated process exposing the front side metallization 104.

The at least one back-end-of-line process may include an adhere process (e.g., a gluing process), a sinter process, a solder process, and/or a bond process. The back-end-of-line process itself may essentially be performed as known in the art.

In various embodiments, the die package 300 may include the die 100 in accordance with various embodiment, including a front side metallization 104 and/or a back side metallization 110.

The die package 300 may further include encapsulation material 322 encapsulating the die 100, and at least one electrically conductive connecting structure 320 fixed to the front side metallization 104 (this is shown in the exemplary embodiment of FIG. 3). Alternatively or additionally, the at least one electrically conductive connecting structure 320 may be fixed to the back side metallization 110 of the die 100.

The die package 300 may further include at least one carrier 332 (in FIG. 3, the carrier 332 may include a stack of four layers 324, 326, 328, 330) onto which the die 100 may be mounted. The carrier 332 may be configured essentially as known in the art.

In various embodiments, the carrier 332 may at least partially be free from the encapsulation material 322. For example, electrical connection structures, for example the carrier layer 324, may be free from the electrically insulating encapsulation material 322.

In various embodiments, the passivation layer 122 may be formed over the front side metallization 104 or over the back side metallization 110. The other of the front side metallization 104 and the back side metallization 110 may be free from the passivation layer 122. Or, more generally phrased, only one of the main surfaces of the die 100 may be covered by the passivation layer 122.

This may be a direct result of the forming of the passivation layer 122 being conducted while the dies 101D are mounted to the auxiliary carrier 102, and thus a result of the easy production process.

In various embodiments, the at least one electrically conductive connecting structure 320 may be fixed to the front side metallization 104 of the die 100 and/or to the back side metallization 110 of the die 100 in an arrangement that penetrates the passivation layer 122.

Figure 4:
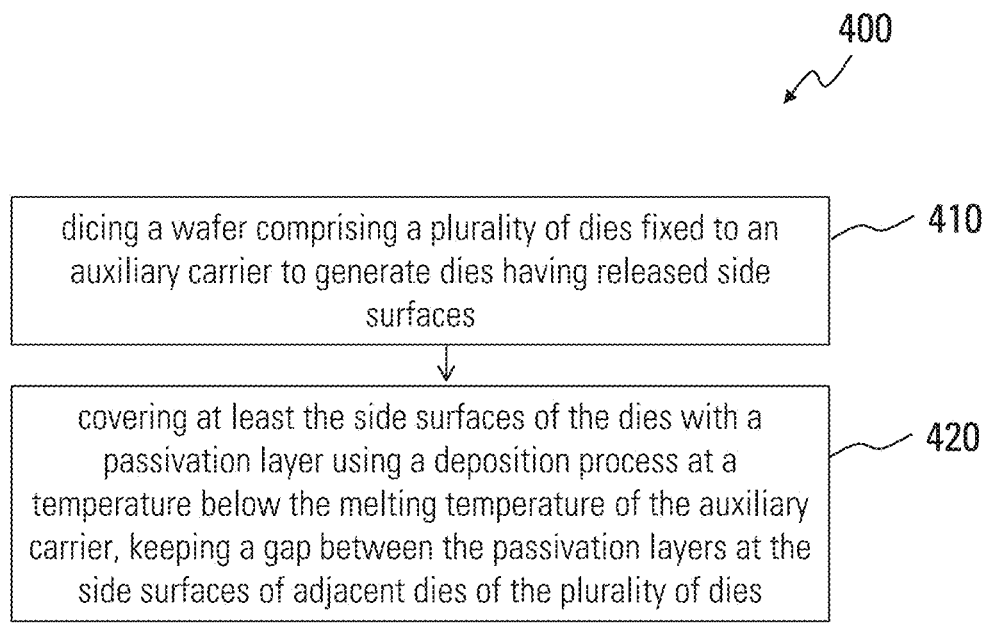
FIG. 4 shows a flow diagram of a method of manufacturing a semiconductor package in accordance with various embodiments.

FIG. 4 shows a flow diagram 400 of a method of manufacturing a semiconductor package in accordance with various embodiments.

The method may include singulating a wafer including a plurality of dies fixed to an auxiliary carrier to generate dies having released side surfaces (410), and covering at least the side surfaces of the dies with a passivation layer using a deposition process at a temperature below the melting temperature of the auxiliary carrier, keeping a gap between the passivation layers at the side surfaces of adjacent dies of the plurality of dies (420).

Various examples will be illustrated in the following:

Example 1 is method of manufacturing a semiconductor package. The method may include singulating a wafer including a plurality of dies fixed to an auxiliary carrier to generate dies having released side surfaces, covering at least the side surfaces of the dies with a passivation layer using a deposition process at a temperature below the melting temperature of the auxiliary carrier, keeping a gap between the passivation layers at the side surfaces of adjacent dies of the plurality of dies.

In Example 2, the subject-matter of Example 1 may optionally include performing at least one back-end-of-line process for the dies having the covered side surfaces.

In Example 2, the subject-matter of Example 1 or 2 may optionally include that the auxiliary carrier is an adhesion tape.

In Example 4, the subject-matter of any of Examples 1 to 3 may optionally include that the layer thickness of the passivation layer is selected to allow the at least one back-end-of-line process to penetrate through the passivation layer.

In Example 5, the subject-matter of any of Examples 1 to 4 may optionally include that the layer thickness of the passivation layer is in the range from about 1 nm to about 50 nm.

In Example 6, the subject-matter of any of Examples 1 to 5 may optionally include that the deposition process is performed at a temperature below approximately 150° C.

In Example 7, the subject-matter of any of Examples 1 to 6 may optionally include that the deposition process is selected from a group of deposition processes consisting of atomic layer deposition (ALD), plasma enhanced atomic layer deposition (PEALD), pulsed atomic layer deposition (pulsed ALD), pulsed atomic layer chemical vapor deposition (pulsed AL-CVD), and metal organic chemical vapor deposition (MOCVD).

In Example 8, the subject-matter of any of Examples 1 to 7 may optionally include that the distance between all adjacent generated dies of the plurality of dies is in a range from about 10 μm to about 50 μm.

In Example 9, the subject-matter of any of Examples 1 to 8 may optionally include that the at least one back-end-of-line process includes a process selected from a group consisting of an adhere process (e.g., a gluing process), a sinter process, a solder process, and a bond process.

In Example 10, the subject-matter of any of Examples 1 to 9 may optionally include that the passivation layer includes or consists of an oxide, a fluoride, a nitride, and/or a metal.

In Example 11, the subject-matter of any of Examples 1 to 10 may optionally include that the passivation layer includes or consists of at least one material selected from a group consisting of aluminum oxide, titanium oxide, silicon oxide, tantal oxide, and zirconium oxide.

In Example 12, the subject-matter of any of Examples 1 to 11 may optionally further include stretching the auxiliary carrier, thereby increasing a distance between adjacent dies before the covering the side surfaces of the dies.

In Example 13, the subject matter of any of Examples 1 to 12 may optionally include that the singulating includes sawing, laser cutting, stealth dicing, dice-before-grinding and/or etching, for example plasma etching.

Example 14 is a die. The die may include a die body including a front surface, a rear surface, and a plurality of side surfaces, and an atomic layer deposition passivation layer covering the front surface and all side surfaces, the rear side being free from the atomic layer deposition passivation layer.

In Example 15, the subject-matter of Example 14 may optionally include that the layer thickness of the passivation layer is in the range from about 1 nm to about 50 nm.

In Example 16, the subject-matter of Example 14 or 15 may optionally include that the passivation layer is a low-temperature deposited layer deposited at a temperature below approximately 150° C.

In Example 17, the subject-matter of any of Examples 14 to 16 may optionally include that the passivation layer is formed by a deposition process selected from a group of deposition processes consisting of atomic layer deposition (ALD), plasma enhanced atomic layer deposition (PEALD), pulsed atomic layer deposition (pulsed ALD), pulsed atomic layer chemical vapor deposition (pulsed AL-CVD), and metal organic chemical vapor deposition (MOCVD).

In Example 18, the subject-matter of any of Examples 14 to 17 may optionally include that the passivation layer includes or consists of an oxide, a fluoride, a nitride, and/or a metal.

In Example 19, the subject-matter of any of Examples 14 to 18 may optionally include that the passivation layer includes or consists of at least one material selected from a group consisting of aluminum oxide, titanium oxide, silicon oxide, tantal oxide, and zirconium oxide.

Example 20 is a die package. The die package may include a die of any of Examples 14 to 19 including a front side metallization and/or a back side metallization, encapsulation material encapsulating the die, and at least one electrically conductive connecting structure fixed to the front side metallization of the die and/or to the back side metallization of the die.

In Example 21 the subject-matter of Example 20 may optionally include that the passivation layer is formed over the front side metallization or over the back side metallization.

In Example 22, the subject-matter of Example 21 may optionally include that the at least one electrically conductive connecting structure fixed to the front side metallization of the die and/or to the back side metallization of the die is arranged penetrating the passivation layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of manufacturing a semiconductor package, the method comprising:
singulating a wafer comprising a plurality of dies fixed to an auxiliary carrier to generate dies having released side surfaces;
covering at least the side surfaces of the dies with a passivation layer using a deposition process at a temperature below the melting temperature of the auxiliary carrier, keeping a gap between the passivation layers at the side surfaces of adjacent dies of the plurality of dies; and
removing each die from the auxiliary carrier.

2. The method of claim 1, further comprising:
performing at least one back-end-of-line process for the dies having the covered side surfaces.

3. The method of claim 1,
wherein the auxiliary carrier is an adhesion tape.

4. A method of manufacturing a semiconductor package, the method comprising:
singulating a wafer comprising a plurality of dies fixed to an auxiliary carrier to generate dies having released side surfaces;
covering at least the side surfaces of the dies with a passivation layer using a deposition process at a temperature below the melting temperature of the auxiliary carrier, keeping a gap between the passivation layers at the side surfaces of adjacent dies of the plurality of dies; and removing each die from the auxillary carrier,
wherein the layer thickness of the passivation layer is selected to allow the at least one back-end-of-line process to penetrate through the passivation layer.

5. The method of claim 1,
wherein the layer thickness of the passivation layer is in the range from about 1 nm to about 50 nm.

6. The method of claim 1,
wherein the deposition process is performed at a temperature below approximately 150° C.

7. The method of claim 1,
wherein the deposition process is selected from a group of deposition processes consisting of:
atomic layer deposition (ALD);
plasma enhanced atomic layer deposition (PEALD);
pulsed atomic layer deposition (pulsed ALD);
pulsed atomic layer chemical vapor deposition (pulsed AL-CVD); and
metal organic chemical vapor deposition (MOCVD).

8. The method of claim 1,
wherein the distance between all adjacent generated dies of the plurality of dies is in a range from about 10 μm to about 50 μm.

9. The method of claim 2,
wherein the at least one back-end-of-line process comprises a process selected from a group consisting of:
adhere process;
sinter process;
solder process; and
bond process.

10. The method of claim 1,
wherein the passivation layer comprises or consists of an oxide, a fluoride, a nitride, and/or a metal.

11. The method of claim 1,
wherein the passivation layer comprises or consists of at least one material selected from a group consisting of:
aluminum oxide;
titanium oxide;
silicon oxide;
tantal oxide; and
zirconium oxide.

12. The method of claim 1, further comprising:
stretching the auxiliary carrier, thereby increasing a distance between adjacent dies before the covering the side surfaces of the dies.

13. The method of claim 1,
wherein covering at least the side surfaces of the dies with the passivation layer comprises covering the side surfaces of the dies and a main surface of the dies facing away from the auxiliary carrier with the passivation layer.

14. The method of claim 1, further comprising:
mounting each die on a further carrier after removing each die from the auxiliary carrier.

15. The method of claim 14,
wherein the further carrier comprises a stack of multiple layers.

16. The method of claim 1,
wherein the dies comprise a front side metallization and/or a back side metallization.

17. The method of claim 16, further comprising:
fixing at least one electrically conductive connecting structure to the front side metallization of each die and/or to the back side metallization of each die.

18. The method of claim 17,
wherein fixing the at least one electrically conductive connecting structure comprises fixing the at least one electrically conductive connecting structure to the front side metallization of each die and/or to the back side metallization of each die in an arrangement that penetrates the passivation layer.

19. The method of claim 1, further comprising:
encapsulating each die after removing each die from the auxiliar carrier.

20. A method of manufacturing a semiconductor package, the method comprising:
singulating a wafer comprising a plurality of dies fixed to an auxiliary carrier to generate dies having released side surfaces, each die comprising a front side metallization and a back side metallization; and
covering at least the side surfaces of the dies with a passivation layer using a deposition process at a temperature below the melting temperature of the auxiliary carrier, keeping a gap between the passivation layers at the side surfaces of adjacent dies of the plurality of dies.

* * * * *